US010794318B2

(12) United States Patent
Kahlert

(10) Patent No.: US 10,794,318 B2
(45) Date of Patent: Oct. 6, 2020

(54) METHOD AND APPARATUS FOR OPERATING AN EC-FUEL PUMP

(71) Applicant: VOLKSWAGEN AG, Wolfsburg (DE)

(72) Inventor: Andreas Kahlert, Wolfsburg (DE)

(73) Assignee: VOLKSWAGEN AG, Wolfsburg (DE)

( * ) Notice: Subject to any disclaimer, the term of this patent is extended or adjusted under 35 U.S.C. 154(b) by 291 days.

(21) Appl. No.: 14/926,629

(22) Filed: Oct. 29, 2015

(65) Prior Publication Data

US 2016/0123267 A1 May 5, 2016

(30) Foreign Application Priority Data

Oct. 30, 2014 (DE) ........................ 10 2014 222 162

(51) Int. Cl.
*F02D 41/30* (2006.01)
*F04C 15/00* (2006.01)
(Continued)

(52) U.S. Cl.
CPC ......... *F02D 41/3082* (2013.01); *F02M 37/08* (2013.01); *F02M 59/12* (2013.01);
(Continued)

(58) Field of Classification Search
CPC .... F04D 15/0066; F04D 15/0088; F04C 2/10; F04C 14/08; F04C 15/008;
(Continued)

(56) References Cited

U.S. PATENT DOCUMENTS 5,842,454 A * 12/1998 Miwa .................. F02D 41/3082 123/179.17
6,034,493 A * 3/2000 Boyd ...................... H02P 6/182 318/400.31

(Continued)

FOREIGN PATENT DOCUMENTS

DE 19933331 A1 2/2000
DE 102006023985 A1 11/2007

(Continued)

OTHER PUBLICATIONS

Search Report for German Patent Application No. 10 2014 222 162.5; dated Apr. 10, 2015.

*Primary Examiner* — Connor J Tremarche
(74) *Attorney, Agent, or Firm* — Barnes & Thornburg LLP

(57) ABSTRACT

A method for operating an electronically commutated fuel pump with an upstream fuel pump electronics unit of a motor vehicle, wherein the fuel pump is operated at a predefined speed, the method includes detecting a speed irregularity of the electronically commutated fuel pump, the speed irregularity being determined by examining the synchronicity between rotary field and rotor of the fuel pump, and switching over the speed of the electronically commutated fuel pump to a higher speed value than the predefined speed until a stable operation of the fuel pump without loss of synchronicity between rotary field and rotor of the fuel pump is achieved, the switchover of the fuel pump to the higher speed is performed by a predefined speed jump or is (Continued)

performed at predefined speed steps, the speed being increased until stable operation of the fuel pump is achieved.

4 Claims, 1 Drawing Sheet

(51) Int. Cl.

| | |
|---|---|
| ***F04C 14/08*** | (2006.01) |
| ***F02M 59/12*** | (2006.01) |
| ***F04C 2/10*** | (2006.01) |
| ***F04D 15/00*** | (2006.01) |
| ***F02M 37/08*** | (2006.01) |

(52) U.S. Cl.

CPC ................ *F04C 2/10* (2013.01); *F04C 14/08* (2013.01); *F04C 15/008* (2013.01); *F04D 15/0066* (2013.01); *F04D 15/0088* (2013.01); *F05D 2270/024* (2013.01)

(58) Field of Classification Search

CPC .... F02D 41/3082; F02M 37/08; F02M 59/12; F05D 2270/024

USPC ........................................................ 417/44.1

See application file for complete search history.

(56) References Cited

U.S. PATENT DOCUMENTS

| | | | | |
|---|---|---|---|---|
| 2005/0237212 | A1* | 10/2005 | Gustafson ............ | G01R 31/343 340/679 |
| 2011/0120424 | A1* | 5/2011 | Fischer ............... | F02D 41/3082 123/497 |

FOREIGN PATENT DOCUMENTS

| | | | |
|---|---|---|---|
| DE | 102008018603 | A1 | 10/2009 |
| DE | 102010064181 | A1 | 6/2012 |
| DE | 102011106824 | A1 | 1/2013 |
| DE | 102013202301 | A1 | 8/2013 |
| DE | 102012017676 | A1 | 3/2014 |

* cited by examiner

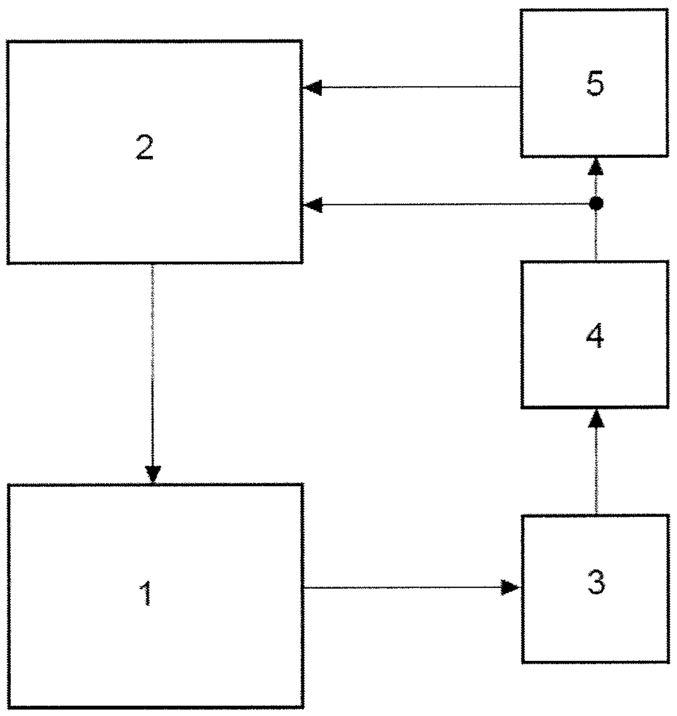
5
2
4
1
3

METHOD AND APPARATUS FOR OPERATING AN EC-FUEL PUMP

PRIORITY CLAIM

This patent application claims priority to German Patent Application No. 10 2014 222 162.5, filed 30 Oct. 2014, the disclosure of which is incorporated herein by reference in its entirety.

SUMMARY

Illustrative embodiments relate to a method for operating an EC fuel pump of a motor vehicle and to a corresponding device.

BACKGROUND

Electronically commutated fuel pumps, referred to as EC fuel pumps for short, which only feed as much petrol or diesel to the engine as required depending on the currently requested power, save a considerable amount of electrical energy compared with the conventional constant feed. In these EC fuel pumps the mechanical coil switchover is replaced by an electronic commutation, i.e. an EC fuel pump does not contain any carbon collector commutators, which are otherwise typical, and the motor of the EC fuel pump is connected to a control unit, which is also referred to as a fuel pump electronics unit or FPE, in which an electric rotary field is generated. This electric rotary field generates a magnetic rotary field in the coils of the pump motor, which are loaded and serve as a stator, and this magnetic rotary field is followed synchronously by the rotor, which is generally permanently magnetic. In other words, the rotary field sets the rotor in rotary motion, such that it drives, for example, an internal gear pump stage via a driver. The fuel pump electronics unit is usually activated via the motor control unit, which communicates the demand of the fuel supply system via a PWM (pulse-width modulation) signal. The fuel pump electronics unit translates the received PWM signal via a stored PWM/speed map into a rotary movement of the fuel pump.

At the same time, the rotor induces an induction voltage in the stator coils, which have not yet been activated, from which induction voltage the speed of the motor can be determined. This speed monitoring enables a reduction of the electrical stator power, without reducing the speed of the motor. For this purpose the current fed to the stator coils is reduced and permanently monitored by means of pulse-width modulation. The pump motor then maintains a default speed at a minimum current demand. The speed only falls below the default value and the motor thus only loses its synchronicity when the ratio of consumed and fed power falls below a certain value, which is dependent on the specific properties of the pump motor. If such a speed drop is identified, the fed electrical power can be increased by the control unit to such an extent that the synchronicity between rotary field and rotor is re-established. In this operating state of an electronically commutated motor, which state is referred to as internal speed control, the motor operates in an energy-optimal state, with controlled speed.

Under certain boundary conditions, such as a sluggishness of the EC fuel pump caused by operation with a highly viscous fuel, operation with a fuel having a high frictional value, i.e. poorly lubricating fuel, unfavorable component tolerances within the fuel pump, operation against a high operating pressure, or further unfavorable boundary conditions, it may be that the rotary field loses the rotor, thus leading to an error entry as a result of an identified speed deviation. This generally is accompanied by an acoustic problem with loudly knocking EC fuel pumps as a result of the synchronization attempts. This acoustic defect caused by the rotor may also cause damage to the EC fuel pump, since the pump coupling may be knocked out and the vehicle then comes to a standstill due to the absence of a fuel supply.

To overcome the problem, a minimum speed for the fuel pump is usually set, which cannot be undershot under any circumstance. However, since the behavior of the fuel pump is dependent on the fuel and component properties and these are subject to a large scattering, there is often a high level of certainty regarding the minimum speed, although this is not necessary. This certainty is accompanied by a higher component loading by the higher current consumption and unfavorable operation in terms of energy.

Disclosed embodiments create a method and a control system for operating an EC fuel pump that ensure a more favorable operation in terms of energy with a stable speed value.

Disclosed embodiments provide a method for operating an EC fuel pump and a corresponding control system.

BRIEF DESCRIPTION OF THE DRAWINGS

Disclosed embodiments will be explained hereinafter on the basis of the sole drawing, in which:

FIG. 1 shows a block diagram of the control system of an electronically commutated fuel pump.

DETAILED DESCRIPTION OF THE DISCLOSED EMBODIMENTS

The method for operating an electronically commutated fuel pump with an upstream fuel pump electronics unit of a motor vehicle, the fuel pump being operated at a predefined speed, has the following steps: detecting a speed irregularity of the electronically commutated fuel pump, the speed irregularity being determined by examining the synchronicity between rotary field and rotor of the fuel pump, and switching over the speed of the electronically commutated fuel pump to a higher speed value than the predefined speed until a stable operation of the fuel pump without loss of synchronicity between rotary field and rotor of the fuel pump is achieved, the switchover of the fuel pump to the higher speed being performed at predefined speed steps or in one step by a predefined speed jump.

Based on the detection of a deviation of the speed from the predefined speed, it is possible, by the increase of the speed proceeding from the predefined operating speed of the rotor, to once again recover the rotor so to speak and easily determine whether the risk of a loss of synchronicity exists.

By means of an immediate increase of the speed by a predefined value, the rotor can be quickly caught. Here, the speed jump must be sufficient to ensure a stable operation of the fuel pump. With this measure the synchronicity problem is quickly stopped, but with an operation that may be less favorable in terms of energy.

The switchover of the fuel pump to the higher speed can be performed in predefined speed steps, the speed being increased until a stable operation of the fuel pump has been achieved. In this way, the synchronicity can be recovered so to speak by a steady process. This may require more time in some circumstances, the speed achieved by the approximation potentially being more favorable in terms of energy.

Once a speed value has been reached for the stable operation, the speed of the fuel pump may be reduced again after a predefined time. In other words, if the operation of the fuel pump has proven to be stable for a predefined period of time, the fuel pump attempts to operate again at the originally predefined speed value, i.e. the operating speed value, to achieve a more favorable energy state in terms of energy. In particular, the fuel pump can be operated again at the predefined speed following the next engine start.

The device for operating an electronically commutated fuel pump with an upstream fuel pump electronics unit, the device being suitable and designed for operation of the method explained above, comprises an arrangement for determining the deviation of the pump speed from a predefined speed, the speed irregularity being determined by an examination of the synchronicity between rotary field and rotor of the fuel pump, and an arrangement for stabilizing the operation of the fuel pump by increasing the speed of the fuel pump to a higher speed, the arrangement for stabilizing the operation of the fuel pump having an arrangement for increasing the speed of the fuel pump at predefined incremental steps or in one step by a predefined speed jump.

With both measures for increasing the speed, it is attempted to re-establish a stable operation of the fuel pump.

The device may have an arrangement for lowering the speed of the fuel pump, the speed being lowered after a predefined period of time or after a predefined event. The predefined event may be, for example, the re-starting of the engine of the motor vehicle after standstill.

In the case of electronically commutated fuel pumps, by means of a pulse-width modulation, the rotational frequency of the magnetic rotary field generated in the pump drive, which defines the rotational frequency of the fuel pump, can be controlled separately from the strength of the magnetic rotary field, which defines the maximum mechanical power available at the pump drive, The control system presented in FIG. 1 of an electronically commutated fuel pump 1 shows a fuel pump electronics unit 2, which is responsible for controlling the fuel pump 1. The fuel pump 1 is monitored by means of an arrangement 3 for determining the speed deviation from the operating speed. In other words, the synchronicity of the rotor of the fuel pump 1 is monitored using the rotary field generated by the stator coils. If the speed deviation from the operating speed determined by the speed monitoring arrangement 1 exceeds a predefined value, a malfunction of the fuel pump 1 is determined. To recover the synchronicity, a speed-increasing arrangement 4 determines an increase of the operating speed, the increase being implemented either by a predefined jump value or by an instrumental increase. The speed is actually increased by the pump electronics unit 2, which is controlled by the speed-increasing arrangement 2 and ensures a suitable increase of the speed of the rotary field.

If a speed increase is implemented to re-establish a stable operation of the fuel pump, this information causes a reset element 5 to be switched on or triggered. This reset element 5 may be a time counter, for example, which, following a predefined period of time, resets the speed of the fuel pump 1 via the fuel pump electronics unit 2 if the arrangement 3 for monitoring the speed of the fuel pump 1 determines a stable operation of the fuel pump during the predefined period. The reset element 5 may also be designed such that it resets the speed of the fuel pump to the operating speed in the case of a predefined event, for example a re-start of the engine following standstill of the motor vehicle.

The following data serves as an example for the operation of an EC fuel pump, the specified data being understood merely as a guideline and varying, of course, depending on the pump type and manufacturer. A standard pump usually operates in a speed range from 1,000 rpm to approximately 10,000 rpm depending on the required pump performance. Once an engine has been started, there is a quick build-up of pressure, the engine being in an idling state, with no direct need for relatively great fuel volumes. If the fuel pump motor is therefore operated for energy reasons at a minimum speed of 1,000 rpm and the pump is sluggish, for example with a fuel of higher viscosity or increased friction in the pump, this may result in a loss of synchronization.

In this case the speed can be increased for example by a fixed value of 500 rpm, whereby a more certain operation of the fuel pump so to speak is achieved abruptly. However, the fuel pump is now operated at a speed of 1500 rpm.

It is also possible to recover the synchronicity of the speed of the fuel pump incrementally, for example in steps of 50 rpm, until stable operation is recovered. In this case it may be that a stable operation is achieved at 1,200 rpm, which is more favorable in terms of energy than an abrupt increase of the speed by a fixed value, however the process takes slightly longer.

Electronically commutated fuel pumps, referred to as EC fuel pumps for short, which only feed as much petrol or diesel to the engine as required depending on the currently requested power, save a considerable amount of electrical energy compared with the conventional constant feed. In these EC fuel pumps the mechanical coil switchover is replaced by an electronic commutation, i.e. an EC fuel pump does not contain any carbon collector commutators, which are otherwise typical, and the motor of the EC fuel pump is connected to a control unit, which is also referred to as a fuel pump electronics unit or FPE, in which an electric rotary field is generated. This electric rotary field generates a magnetic rotary field in the coils of the pump motor, which are loaded and serve as a stator, and this magnetic rotary field is followed synchronously by the rotor, which is generally permanently magnetic. In other words, the rotary field sets the rotor in rotary motion, such that it drives, for example, an internal gear pump stage via a driver. The fuel pump electronics unit is usually activated via the motor control unit, which communicates the demand of the fuel supply system via a PWM (pulse-width modulation) signal. The fuel pump electronics unit translates the received PWM signal via a stored PWM/speed map into a rotary movement of the fuel pump.

At the same time, the rotor induces an induction voltage in the stator coils, which have not yet been activated, from which induction voltage the speed of the motor can be determined. This speed monitoring enables a reduction of the electrical stator power, without reducing the speed of the motor. For this purpose the current fed to the stator coils is reduced and permanently monitored by means of pulse-width modulation. The pump motor then maintains a default speed at a minimum current demand. The speed only falls below the default value and the motor thus only loses its synchronicity when the ratio of consumed and fed power falls below a certain value, which is dependent on the specific properties of the pump motor. If such a speed drop is identified, the fed electrical power can be increased by the control unit to such an extent that the synchronicity between rotary field and rotor is re-established. In this operating state of an electronically commutated motor, which state is referred to as internal speed control, the motor operates in an energy-optimal state, with controlled speed.

A method for operating an electronically commutated fuel pump is known from document DE 10 2011 106 824 A1, wherein the electrical power consumption of the fuel pump can be controlled by means of a pulse-width modulation at constant speed. In that case, the control is designed in a first operating state in respect of a minimal power consumption, wherein, in a second operating state, the power consumption is increased so as to heat the fuel fed by the fuel pump, this heating being effected by a generation of resistive heat. The operating speed of the fuel pump is kept constant here.

Document DE 199 33 331 A1 discloses a method and a device for monitoring and controlling the speed of a brushless motor controlled by a controller, wherein switching signals are made available to a plurality of switching elements by the controller. A line voltage of the motor is then compared with a signal representing the voltage at the neutral point of the motor to generate a comparison signal. The comparison signal is related to a switching signal to generate a compiled feedback signal, which represents the speed of the rotor of the motor compared with the speed of the rotary magnetic field generated by the stator.

Document DE 10 2008 018 603 A1 relates to a method for controlling or regulating a feed capacity of a fuel pump for supplying a fuel to an internal combustion engine of a motor vehicle. In that case a target feed capacity of the fuel pump is determined by means of parameters characterizing a state of the internal combustion engine, the target feed capacity is converted into a target speed of the fuel pump by means of a map, and an actual speed of the fuel pump is set as a function of the calculated target speed.

Document DE 10 2006 023 985 A1 describes a method for operating a pump with an electronically commutating electric machine, wherein the electric machine drives the pump consisting of at least one pump stage, such that a medium is sucked in by the pump and is fed at a higher pressure to a consumer. The electric machine is started by a first signal and is operated at idling speed, and is accelerated to rated speed when the end consumer is started by a second signal.

Document DE 10 2013 202 301 A1 describes a method for detecting and isolating a fault in a fuel feed system, which comprises a fuel pump and a fuel pump motor, wherein the fuel pressure, the pump current and the pump voltage are monitored.

Document DE 10 2010 064 181 A1 describes a fuel supply system for an internal combustion engine having a fuel pump, wherein a change to the pumped fuel volume in the direction of a greater or lesser fuel demand is identified and the fuel pump is controlled accordingly in an anticipatory manner.

A method for operating a fuel feed arrangement of a motor vehicle is known from document DE 10 2012 017 676 A1, wherein the fuel feed arrangement has a fuel pump driven by a brushless DC motor. Here, the DC motor is operated in an operating mode selected from two operating modes at least when a minimum speed is reached. In the first operating mode an angle-of-rotation position of a rotor of the DC motor is determined and a commutation is performed on the basis of the angle-of-rotation position at a first current intensity, and in the second operating mode the DC motor is controlled to heat the fuel as a stepper motor at a second, greater current intensity.

Under certain boundary conditions, such as a sluggishness of the EC fuel pump caused by operation with a highly viscous fuel, operation with a fuel having a high frictional value, i.e. poorly lubricating fuel, unfavorable component tolerances within the fuel pump, operation against a high operating pressure, or further unfavorable boundary conditions, it may be that the rotary field loses the rotor, thus leading to an error entry as a result of an identified speed deviation. This generally is accompanied by an acoustic problem with loudly knocking EC fuel pumps as a result of the synchronization attempts. This acoustic defect caused by the rotor may also cause damage to the EC fuel pump, since the pump coupling may be knocked out and the vehicle then comes to a standstill due to the absence of a fuel supply.

To overcome the problem, a minimum speed for the fuel pump is usually set, which cannot be undershot under any circumstance. However, since the behavior of the fuel pump is dependent on the fuel and component properties and these are subject to a large scattering, there is often a high level of certainty regarding the minimum speed, although this is not necessary. This certainty is accompanied by a higher component loading by the higher current consumption and unfavorable operation in terms of energy.

Disclosed embodiments create a method and a control system for operating an EC fuel pump that ensure a more favorable operation in terms of energy with a stable speed value.

Disclosed embodiments provide a method for operating an EC fuel pump and a corresponding control system.

The invention claimed is:

1. A method for operating an electronically commutated fuel pump under control of an upstream fuel pump electronics unit of a motor vehicle to avoid a speed irregularity indicative of a malfunction of the fuel pump resulting from lack of synchronicity of a rotor of the fuel pump occurring when a ratio of consumed and fed power falls below a threshold value, wherein pulse-width modulation is used to control rotational frequency of a magnetic rotary field generated in a drive of the fuel pump, wherein the rotational frequency is controlled separately from a strength of the magnetic rotary field, which defines maximum mechanical power available at the fuel pump drive, the fuel pump being operated at a predefined speed corresponding to stable operation of the fuel pump, the method comprising:

monitoring an operating speed of the fuel pump to determine a speed deviation from the predefined speed, wherein the speed deviation indicates the speed irregularity indicative of the malfunction of the fuel pump resulting from lack of synchronicity of the rotor of the fuel pump, wherein the speed deviation is determined by examination of the synchronicity between the magnetic rotary field and the rotor of the fuel pump using the magnetic rotary field generated by stator coils in the pump drive; and in response to the determination that the speed deviation from the predefined speed exceeds a predefined value, implementing an increase of the operating speed of the upstream fuel pump using a pump electronics unit to re-establish stable operation of the fuel pump resulting from rotor synchronicity, wherein the control of the increase of the operating speed is performed by the upstream fuel pump electronics unit in one step by a predefined speed jump or is performed at predefined speed steps, the speed being increased until stable operation of the fuel pump is re-achieved as determined based on the speed deviation determined based on the examination of the synchronicity between the magnetic rotary field and the rotor of the fuel pump using the magnetic rotary field generated by stator coils in the pump drive, wherein the upstream fuel pump electronics unit controls the electronically commutated fuel pump based on the detection of the speed irregularity indicative of a malfunction of the fuel pump resulting from lack of synchronicity of a rotor of the fuel pump to cause recovery of the rotor by the rotary field, maintain the higher operating speed for a specified period of time such that the operation of the electronically commutated fuel pump under control of the upstream fuel pump electronics unit of the motor vehicle avoids the speed irregularity indicative of the malfunction of the fuel pump resulting from lack of synchronicity of the rotor of the fuel pump occurring when the ratio of consumed and fed power falls below the threshold value to reduce a risk of loss of synchronicity, and wherein the method further comprises the upstream fuel pump electronics unit controlling the electronically commutated fuel pump to lower the operating speed of the electronically commutated fuel pump again after a predefined time once an operating speed value for stable operation has been reached.

2. The method of claim 1, further comprising the upstream fuel pump electronics unit controlling the electronically commutated fuel pump to operate again at the predefined speed in response to the engine next being started.

3. An electronically commutated fuel pump for a motor vehicle, the fuel pump comprising:

a fuel pump drive; and an upstream fuel pump electronics unit for controlling operation of the electronically commutated fuel pump to avoid a speed irregularity indicative of a malfunction of the fuel pump resulting from lack of synchronicity of a rotor of the fuel pump occurring when a ratio of consumed and fed power falls below a threshold value, wherein pulse-width modulation is used to control rotational frequency of a magnetic rotary field generated in the drive of the fuel pump, wherein the rotational frequency is controlled separately from a strength of the magnetic rotary field, which defines maximum mechanical power available at the fuel pump drive, the fuel pump being operated at a predefined speed corresponding to stable operation of the fuel pump as determined based on the speed deviation determined based on the examination of the synchronicity between the magnetic rotary field and the rotor of the fuel pump using the magnetic rotary field generated by stator coils in the pump drive, wherein a monitor is used to monitor an operating speed of the fuel pump to determine a speed deviation from the predefined speed, wherein the speed deviation indicates the speed irregularity indicative of malfunction of the fuel pump resulting from lack of synchronicity of the rotor of the fuel pump, wherein the speed deviation is determined by the monitor by examination of the synchronicity between the magnetic rotary field and the rotor of the fuel pump using the magnetic rotary field generated by stator coils in the pump drive, wherein the upstream fuel pump electronic unit is configured to, in response to the determination that the speed deviation from the predefined speed exceeding a predefined value, implement an increase of the operating speed of the upstream fuel pump to re-establish stable operation of the fuel pump resulting from rotor synchronicity, wherein the control of the increase of the operating speed is performed by the upstream fuel pump electronics unit in one step by a predefined speed jump or is performed at predefined speed steps, the speed being increased until stable operation of the fuel pump is re-achieved, wherein the upstream fuel pump electronics unit controls the electronically commutated fuel pump based on the detection of the speed irregularity indicative of a malfunction of the fuel pump resulting from lack of synchronicity of a rotor of the fuel pump to cause recovery of the rotor by the rotary field, maintain the higher operating speed for a specified period of time such that the operation of the electronically commutated fuel pump under control of the upstream fuel pump electronics unit of the motor vehicle avoids the speed irregularity indicative of the malfunction of the fuel pump resulting from lack of synchronicity of the rotor of the fuel pump occurring when the ratio of consumed and fed power falls below the threshold value to reduce a risk of loss of synchronicity, and wherein the upstream fuel pump electronics unit controls the electronically commutated fuel pump to lower the operating speed of the electronically commutated fuel pump again after a predefined time once an operating speed value for stable operation has been reached.

4. The electronically commutated fuel pump of claim 3, wherein the upstream fuel pump electronics unit controls the electronically commutated fuel pump to operate again at the predefined speed in response to the engine next being started.

* * * * *